United States Patent [19]
Yetter

[11] Patent Number: 5,289,403
[45] Date of Patent: Feb. 22, 1994

[54] SELF-TIMED CONTENT ADDRESSABLE MEMORY ACCESS MECHANISM WITH BUILT-IN MARGIN TEST FEATURE

[75] Inventor: Jeffry D. Yetter, Ft. Collins, Colo.

[73] Assignee: Hewlett-Packard Company, Palo Alto, Calif.

[21] Appl. No.: 726,617

[22] Filed: Jul. 8, 1991

[51] Int. Cl.$^5$ .............................................. G11C 15/00
[52] U.S. Cl. ...................................... 365/49; 365/194; 365/210; 365/233; 307/269
[58] Field of Search ............ 365/49, 194, 210, 230.03, 365/233; 307/269

[56] References Cited

U.S. PATENT DOCUMENTS

| | | | |
|---|---|---|---|
| 4,532,606 | 7/1985 | Phelps | 365/49 |
| 4,622,653 | 11/1988 | McElroy | 365/49 |
| 4,754,164 | 6/1988 | Flora et al. | 307/269 |
| 4,757,474 | 7/1988 | Fukushi et al. | 365/210 |
| 4,760,290 | 7/1988 | Martinez | 307/465 |
| 4,811,294 | 3/1989 | Kobayashi et al. | 365/189.05 |
| 4,841,488 | 6/1989 | Sanada | 365/194 |
| 4,930,104 | 5/1990 | Nakagawa et al. | 365/49 |
| 4,953,128 | 8/1990 | Kawai et al. | 365/194 |
| 5,010,516 | 4/1991 | Oates | 365/49 |
| 5,031,142 | 7/1991 | Castro | 365/49 |
| 5,140,184 | 8/1992 | Hamamoto | 307/303.1 |
| 5,233,565 | 8/1993 | Wang | 365/233.5 |

OTHER PUBLICATIONS

M. Forsyth et al., "CMOS PA-RISC Processor For A New Family Of Workstations," *IEEE COMPCON Spring 1991, Digest of Technical Papers*, Feb. 1991.
D. Odnert et al., "Architecture And Compiler Enhancements For PA-RISC Workstations," *IEEE COMPCON Spring 1991, Digest of Technical Papers*, Feb. 1991.
R. Horning et al., "System Design For A Low Cost PA-RISC Desktop Workstation," *IEEE COMPCON Spring 1991, Digest of Technical Papers*, Feb. 1991.

*Primary Examiner*—William L. Sikes
*Assistant Examiner*—Terry D. Cunningham

[57] ABSTRACT

A content addressable memory (CAM) access system and method having self-timing and built-in margin test features. The present invention includes a compare array which has multiple comparator paths. The comparator paths generate multiple mismatch indications after receiving a system clock signal. The present invention also includes a row driver which receives the mismatch indications produced by the compare array after receiving a Tclock signal. The row driver generates multiple row enables based on the mismatch indications. The Tclock signal is generated only after the mismatch indications are valid. Thus, the row driver always receives valid mismatch indications. According to the present invention, the Tclock signal is generated by simulating a worst case path through the compare array. The worst case path produces a dummy mismatch indication. Since the dummy mismatch indication is a product of the worst case path through the compare array, the mismatch indications must be valid when the dummy mismatch indication is valid. Thus, the dummy mismatch indication may be used as the Tclock to cause the row driver to read the mismatch indications. In other words, the dummy mismatch indication may be used as a measure of the amount of time which the compare array requires to generate valid mismatch indications.

8 Claims, 7 Drawing Sheets

SELF-TIMED CONTENT ADDRESSABLE MEMORY ACCESS MECHANISM WITH BUILT-IN MARGIN TEST FEATURE

BACKGROUND OF THE INVENTION

1. Field of the Invention

The present invention relates generally to content addressable memory access systems and methods, and more particularly to content addressable memory access systems and methods having self-timing and built-in margin test features.

2. Related Art

FIG. 1 illustrates a conventional content addressable memory (CAM) 102 for use in a computer system. The CAM 102 has a compare array 104, row drivers 108, and an access array 112.

The compare array 104 has N rows and M columns. Each column of every row contains a data bit and a comparator. Thus, every row in the compare array 104 has M data bits and M comparators.

The compare array 104 receives a compare input 106 having M bits. The compare input 106 is received by every row of the compare array 104. For every row in the compare array 104, the M comparators determine whether the M data bits match or mismatch the compare input 106.

Each row of the compare array 104 has a mismatch indication 122. Thus, there are N mismatch indications 122. A row's mismatch indication 122 is true if the compare input 106 does not match the row's M data bits. A row's mismatch indication 122 is false if the compare input 106 matches the row's M data bits.

The mismatch indications 122 are input to a row driver 108. The row driver 108 produces N row enables 118. The N row enables 118 correspond to the N mismatch indications 122. Specifically, a row enable 118i is asserted if its corresponding mismatch indication 122i is false.

Note that the compare array 104 and the row driver 108 have clock inputs 116 and 117, respectively. The clock inputs 116, 117 are used to determine when the compare array 104 and the row driver 108 receive the compare input 106 and mismatch indications 122, respectively. In other words, the clock inputs 116, 117 are used to determine when the compare input 106 and mismatch indications 122 are valid. As shown in FIG. 1, signals on the clock inputs 116, 117 are conventionally produced by a system clock 114.

The access array 112 has N rows wherein each row contains X bits of data. In other words, the access array 112 contains N data words wherein each data word contains X data bits. A data word in the access array 112 is accessed if its corresponding row enable 118 is asserted.

The CAM 102 operates as follows. All of the N mismatch lines 122 are precharged false (that is, high) during a low phase of the system clock 114. The compare array 104 receives the compare input 106. The compare input 106 either matches none or one or more of the rows in the compare array 104.

If the compare input 106 matches none of the rows in the compare array 104, then all of the mismatch indications 122 fall true. As a result, the row driver 108 does not assert any of the row enables 118. Thus, none of the data words in the access array 112 are accessed.

If the compare input 106 matches a row in the compare array 104, then the row's mismatch indication 122 remains false. As a result, the row driver 108 asserts the corresponding row enable 118 when the system clock 114 attached to the clock input 117 falls. Therefore, the data word in the access array 112 associated with the asserted row enable 118 is accessed.

The mismatch indications 122 must be valid when the row driver 108 uses the mismatch indications 122 to produce the row enables 118. This occurs when the system clock 114 attached to the clock input 117 falls. Otherwise, the row enables 118 will be invalid and a data word from the access array 112 may be incorrectly accessed.

As noted above, the clock inputs 116, 117 determine when the compare array 104 and the row driver 108 receive the compare input 106 and mismatch indications 122, respectively. More precisely, the compare array 104 receives the compare input 106 on a rising edge of the system clock 114 on the clock input 116. The row driver 108 receives the mismatch indications 122 on the subsequent falling edge of the system clock 114 on the clock input 117.

The amount of time between the rising edge and subsequent falling edge of the system clock 114 must be sufficient to allow the compare array 104 to generate valid mismatch indications 122. Otherwise, the row driver 108 will produce invalid row enables 118.

Ordinarily, the amount of time between the rising and subsequent falling edges from the system clock 114 is sufficiently large to allow the compare array 104 to generate valid mismatch indications 122. In fact, the amount of time necessary for the compare array 104 to generate valid mismatch indications 122 is significantly less than the amount of time between the rising and subsequent falling edges from the system clock 114. Thus, it is wasteful to use the system clock 114 to produce the second clock signal on the clock input 117. In other words, the system clock 114 does not provide an adequate measure of the amount of time it takes the compare array 104 to generate valid mismatch indications 122.

Therefore, the conventional CAM 102 is flawed because the exclusive use of the system clock 114 in its access mechanism lowers the rate at which the access array may be accessed.

Therefore, optimized systems and methods for accessing content addressable memories are required. Also, systems and methods for testing such optimized CAM access systems and methods are required.

SUMMARY OF THE INVENTION

The present invention is directed to systems and methods for accessing content addressable memories (CAMs). More particularly, the present invention is directed to CAM access systems and methods having self-timing and built-in margin test features.

The present invention includes a compare array which has multiple comparator paths. The comparator paths generate multiple mismatch indications after receiving a system clock signal.

The present invention also includes a row driver which receives the mismatch indications produced by the compare array after receiving a Tclock signal. The row driver generates multiple row enables based on the mismatch indications.

The Tclock signal is generated only after the mismatch indications are valid. Thus, the row driver always receives valid mismatch indications.

According to the present invention, the Tclock signal is generated by simulating a worst case path through the compare array. The worst case path produces a dummy mismatch indication. Since the dummy mismatch indication is a product of the worst case path through the compare array, the mismatch indications must be valid when the dummy mismatch indication is valid. Thus, the dummy mismatch indication may be used as the Tclock to cause the row driver to read the mismatch indications. In other words, the dummy mismatch indication may be used as a measure of the amount of time which the compare array requires to generate valid mismatch indications.

The worst case path includes a dummy buffer, a dummy row, and a dummy column. The dummy column operates to load the dummy buffer. The dummy row includes M+1 comparators. However, only one of the M+1 comparators (namely, the comparator positioned in the dummy column) operates to generate a valid dummy mismatch indication.

According to the present invention, the dummy mismatch indication is amplified. Also, additional delay is added to the dummy mismatch indication. The amplified and delayed dummy mismatch indication represents the Tclock. During testing, the additional delay may be deleted in order to apply additional stress on the CAM, such that the amplified dummy mismatch indication (rather than the amplified and delayed dummy mismatch indication) represents the Tclock.

Further features and advantages of the present invention, as well as the structure and operation of various embodiments of the present invention, are described in detail below with reference to the accompanying drawings. In the drawings, like reference numbers indicate identical or functionally similar elements.

BRIEF DESCRIPTION OF THE DRAWINGS

The present invention will be described with reference to the accompanying drawings, wherein.

DETAILED DESCRIPTION OF THE PREFERRED EMBODIMENTS

Figure 1:
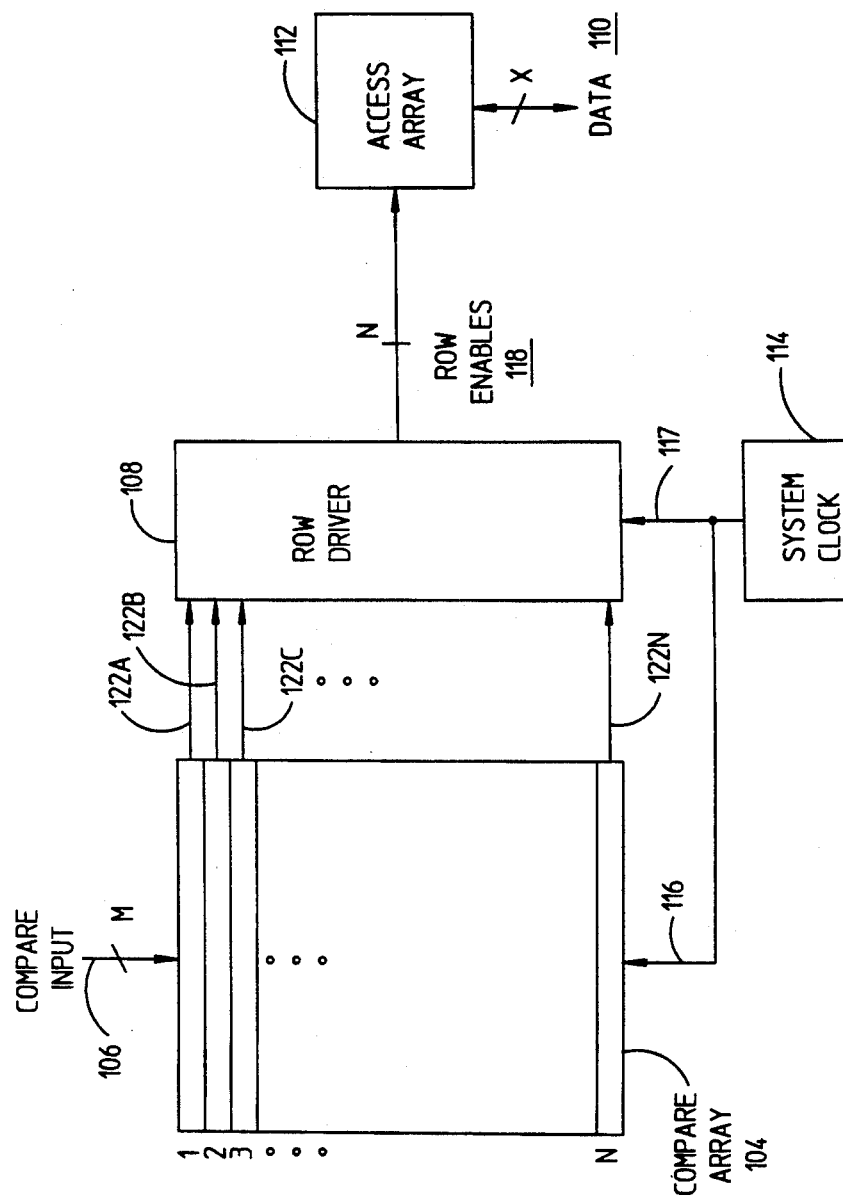
FIG. 1 illustrates a conventional content addressable memory (CAM).
Figure 2:
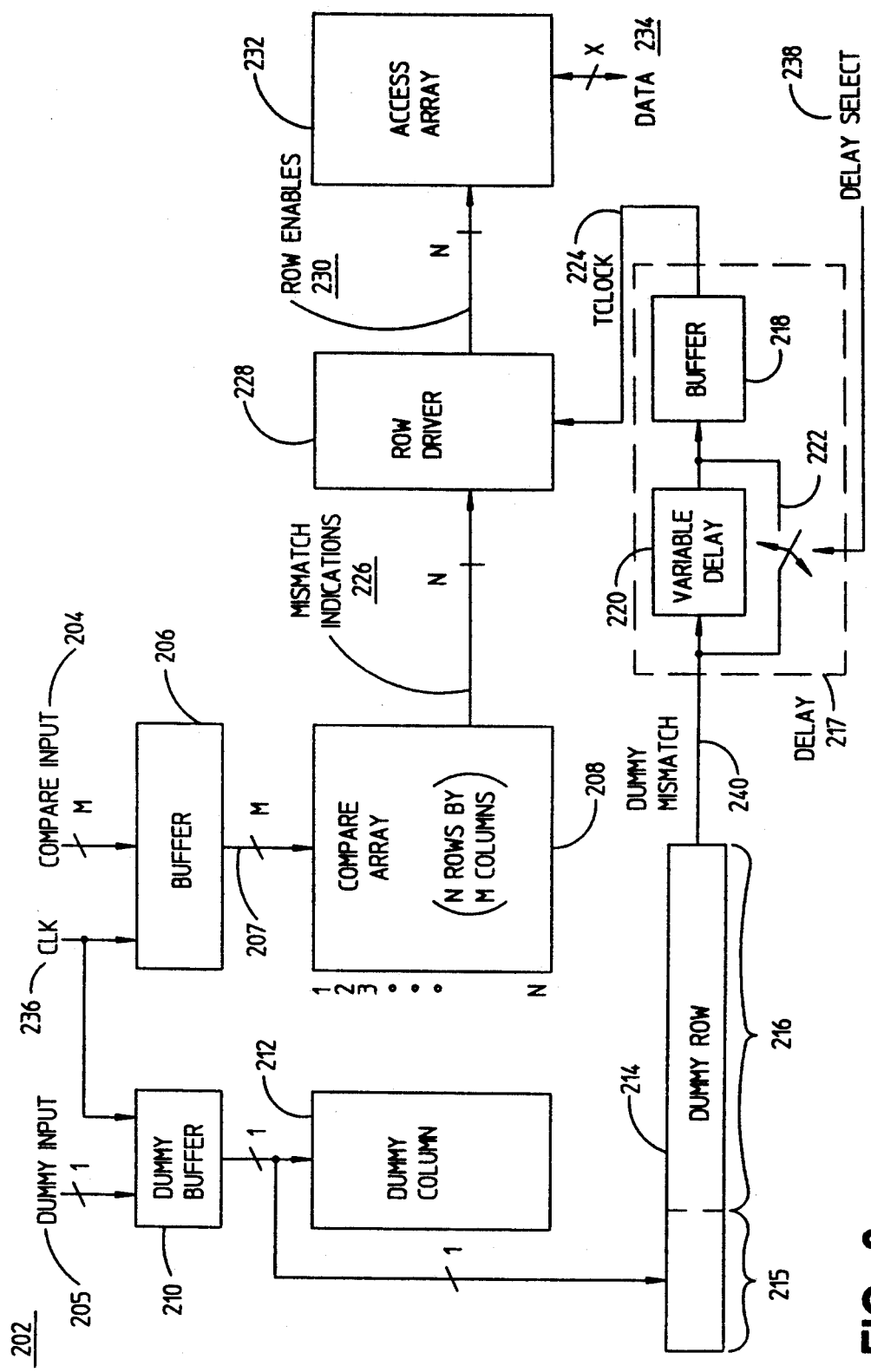
FIG. 2 illustrates a content addressable memory (CAM) 202 according to the present invention.

FIG. 2 illustrates a content addressable memory (CAM) 202 according to the present invention. The CAM 202 of the present invention operates in a central processing unit of a computer system. An overall system which incorporates the present invention is generally described in an article by M. Forsyth et al. titled, "CMOS PA-RISC Processor For a New Family of Workstations," *IEEE COMPCOM Spring '91 Digest of Papers*, February 1991. The environment described in this article is only one of many computer systems in which the present invention could be used. The Forsyth article is incorporated herein by reference as if set forth below in full.

In a preferred embodiment of the present invention, the computer system in which the CAM 202 operates is a Hewlett Packard (HP) Series 700 Workstation.

The CAM 202 includes a buffer 206, a compare array 208, a row driver 228, and an access array 232. The CAM 202 also includes a dummy buffer 210, a dummy column 212, a dummy row 214, and delay 217.

The buffer 206 stores M bits. The dummy buffer 210 stores 1 bit. The compare array 208 includes N rows and M columns. The access array 232 stores N data words, wherein each data word has X bits. In a preferred embodiment of the present invention, N is 100, M is 37, and X is 60.

At a clock (CLK) 236, the buffer 206 receives a compare input 204. The compare input 204 includes M bits. Note that the CLK 236 is simultaneously applied to the dummy buffer 210. At the rising edge of the CLK 236, the dummy buffer 210 receives a dummy input 205. The dummy input is always 1. The buffer 206 produces an encoded compare input 207.

The compare array 208 receives the encoded compare input 207 from the buffer 206. Specifically, every row of the compare array 208 receives the encoded compare input 207.

Each column of every row of the compare array 208 contains a data bit and a comparator. Thus, every row in the compare array 208 has M data bits and M comparators. For every row in the compare array 208, the M comparators determine whether the M data bits match or mismatch the encoded compare input 207.

Each row of the compare array 208 has a mismatch indication 226. Thus, there are N mismatch indications 226. A row's mismatch indication 226 is true if the encoded compare input 207 does not match the row's M data bits. A row's mismatch indication 226 is false if the encoded compare input 207 matches the row's M data bits.

The row driver 228 receives the mismatch indications 226. The row driver 228 produces N row enables 230. The N row enables 230 correspond to the N mismatch indications 226. Specifically, a row enable 230 is asserted if its corresponding mismatch indication 226 is false.

The access array 232 receives the row enables 230. The N row enables 230 correspond to the N data words in the access array 232. Specifically, a data word in the access array 232 is accessed if its corresponding row enable 230 is asserted. The access array 232 is also called a random access memory (RAM).

The CAM 202 of the present invention operates as follows.

During a low time of the CLK 236, all of the mismatch indications 226 are precharged false (that is, high). At the rising edge of CLK 236, the compare input 204 is latched into the buffer 206. Also, the dummy input 205 is latched into the dummy buffer 210.

The compare array 208 receives the encoded compare inputs 207 from the buffer 206. The comparators in the compare array 208 compare the encoded compare input 207 to the data in every row of the compare array 208. The encoded compare input 207 either matches none or one or more of the rows in the compare array 208.

According to the preferred embodiment of the present invention, the mismatch indications 226 are precharged to a high voltage state during the low time of CLK 236. With regard to the mismatch indications 226, the high voltage state represents a logical false, or match, state. The low voltage state represents a logical true, or mismatch, state. Therefore, after the rising edge of the CLK 236, the compare array 208 causes all unmatched mismatch indications 226 (that is, all mismatch indications 226 corresponding to the rows in the compare array 208 which do not match the encoded compare input 207) to go from a high to a low voltage state.

At a falling edge of the Tclock signal 224, the row driver 228 receives the mismatch indications 226 and generates the row enables 230. Specifically, if all of the mismatch indications 226 indicate mismatches, then the row driver 228 does not assert any of the row enables 230. Thus, none of the data words in the access array 232 are accessed.

However, if one or more of the mismatch indications 226 indicate matches, then the row driver 108 asserts the corresponding row enables 230. Therefore, the data words in the access array 232 associated with the asserted row enables 230 are accessed.

The manner in which the CAM 202 of the present invention generates the Tclock signal 224 will now be described.

Conceptually, the CAM 202 of the present invention simulates a worst case path through the compare array 208. The worst case path represents the slowest comparator path in the compare array 208. That is, the worst case path represents the slowest row in the compare array 208 to produce a valid mismatch indication 226. The worst case path may be used to determine the maximum time required for the compare array 208 to generate valid mismatch indications 226. This maximum time is called a worst case path time. The worst case path time is used to determine when to clock the row driver 228. Specifically, after the worst case path time has elapsed, the mismatch indications 226 are valid and may be received by the row driver 228. Therefore, the CAM 202 generates the Tclock signal 224 after the worst case path time has elapsed. For example, suppose that the CAM 202 receives the encoded compare input 207 at T0. Also suppose that the CAM 202 determines that the worst case path time is 4 nsec. According to this scenario, the CAM 202 would generate the Tclock signal 224 four nsec after T0.

Note that the CAM 202 of the present invention generates its own timing signals (that is, the Tclock signal 224). Thus, the CAM 202 of the present invention is self-timed.

The dummy buffer 210, dummy column 212, dummy row 214, and delay component 217 are used to generate the Tclock signal 224. The dummy buffer 210, dummy column 212, dummy row 214, and delay component 217 are described below.

The dummy column 212 and dummy row 214 are manufactured using the same process and under the same conditions and at the same time as the columns and rows of the compare array 208.

The dummy column 212 contains N rows, wherein each row contains a data bit and a comparator. The N comparators of the dummy column 212 are not connected to the N mismatch indications 226 and thus do not affect the generation of the mismatch indications 226. The dummy column 212 is present only to place a maximum load on the dummy buffer 210. This maximum load is accomplished by forcing a 1 at the dummy input 205 and storing a 0 in each dummy comparator storage element in the dummy column 212 so that each row in the dummy column 212 mismatches.

The dummy row 214 simulates the worst case path through the compare array 208. The dummy row 214 contains M columns 216 plus an additional column 215 for a total of M+1 columns. Each column contains a data bit and a comparator.

The M columns 216 receive an input of 0 on their M compare inputs (not shown in FIG. 2). The additional column 215 receives an 1-bit input from the dummy buffer 210. Note that the additional column 215 receives the 1-bit input from the dummy buffer 210 at the same time that the compare array 208 receives the encoded compare input 207 from the buffer 206.

As noted above, the dummy row 214 simulates the worst case path. Specifically, the M columns 216 of the dummy row 214 are implemented such that the M comparators in the M columns 216 indicate matches. This is accomplished by storing a zero in the M dummy storage elements of the M columns 216. The additional column 215 of the dummy row 214 is implemented such that the comparator in the additional column 215 indicates a mismatch. Therefore, only the additional column 215 pulls down a dummy mismatch indication 240 associated with the dummy row 214 from the high voltage state to the low voltage stage (recall that the mismatch indications 226, including the dummy mismatch indication 240, are precharged to the high voltage state prior to the first pulse from the CLK 236).

The amount of time necessary to pull down the dummy mismatch indication 240 is at least as great as the amount of time necessary to pull down any of the mismatch indications 226 since only the additional column 215 pulls down the dummy mismatch indication 240. Therefore, the dummy row 214 simulates the worst case path through the compare array 208.

The dummy mismatch indication 240 produces the Tclock signal 224. Since the dummy mismatch indication 240 is a product of the worst case path through the compare array 208, the mismatch indications 226 must be valid when the dummy mismatch indication 240 is valid. Thus, the Tclock signal 224 produced by the dummy mismatch indication 240 may be used to cause the row driver 228 to read the mismatch indications 226. In other words, the dummy mismatch indication 240 may be used as a measure of the amount of time which the compare array 208 requires to generate valid mismatch indications 226.

To ensure that the dummy mismatch indication 240 is valid only after the mismatch indications 226 are valid, the delay component 217 of the present invention introduces additional delay. Following the delay introduced by the delay component 217, the Tclock signal 224 is produced.

The delay component 217 of the present invention includes a buffer 218 and a variable delay 220. The buffer 218 introduces mandatory delay. In addition to introducing mandatory delay, the buffer 218 provides gain.

As indicated by an alternate path 222, the variable delay 220 may or may not introduce additional delay. The variable delay 220 is used to test the CAM 202. Due to manufacturing imperfections, all CAMs 202 produced according to the teachings of the present invention may not operate correctly. Specifically, due to manufacturing imperfections, the compare array 208 in some CAMs 202 may not produce valid mismatch indications 226 until after the Tclock 224 is generated. Such CAMs 202 are faulty due to manufacturing imperfections.

The variable delay 220 is used to identify these faulty CAMs 202. After CAMs 202 are manufactured, the CAMs 202 are tested. During testing of a CAM 202, the alternate path 222 is closed such that less delay is introduced. By introducing less delay, the CAM 202 under test is stressed. If the CAM 202 operates correctly (that is, the compare array 208 produces valid mismatch indications 226 only before the Tclock 224 is generated) while stressed, then the CAM 202 is not faulty. However, if the CAM 202 operates incorrectly while stressed, then the CAM 202 is faulty due to manufacturing conditions and may be discarded.

During normal operations, the alternate path 222 is open such that the variable delay 220 is introduced (that is, the CAM 202 is not stressed). Whether or not the alternate path 222 is open or closed is user-controllable by a delay select 238.

The CAM 202 of the present invention shall now be described in greater detail.

Figure 3:
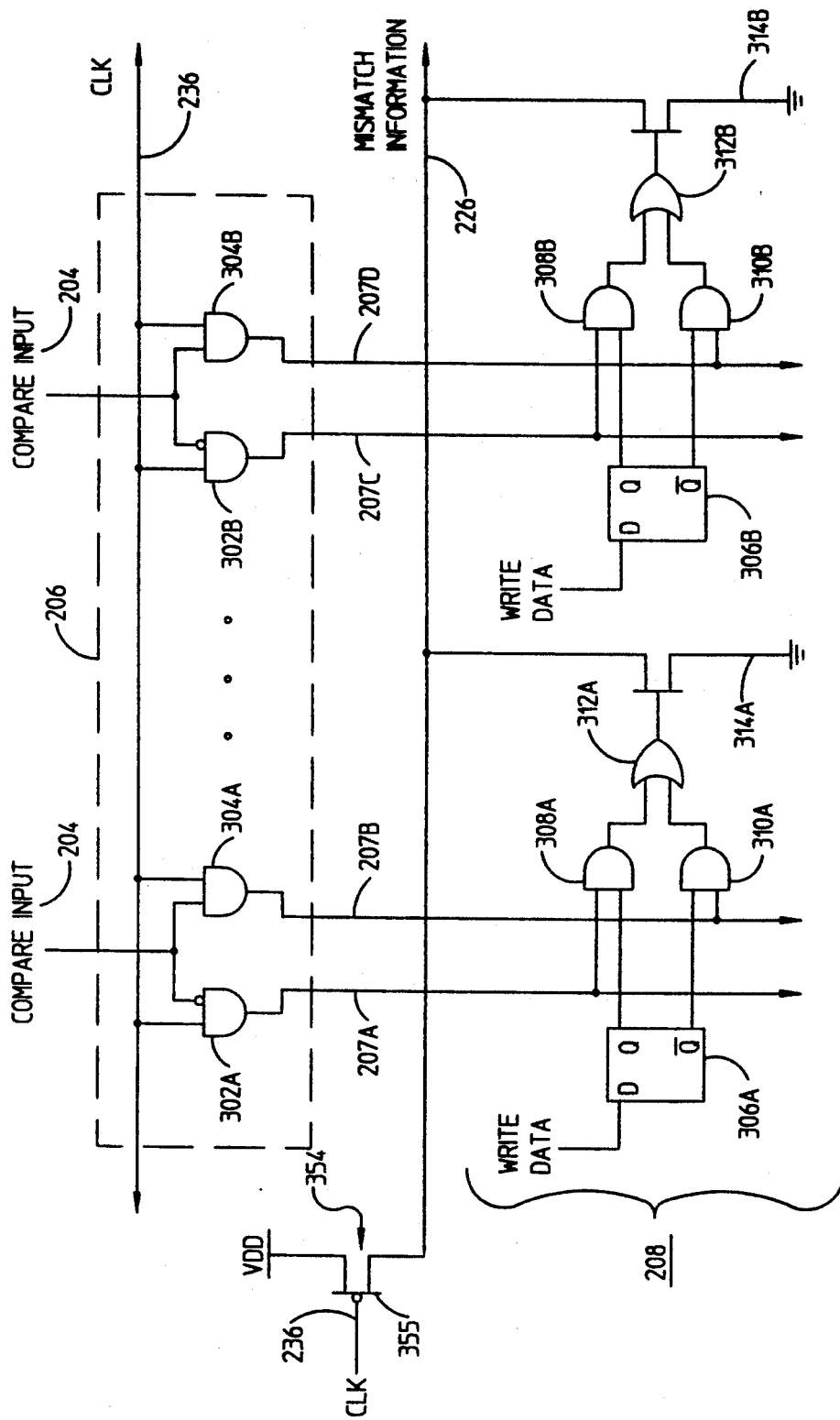
FIG. 3 illustrates a row of a compare array 208 of the present invention.

FIG. 3 illustrates one of the rows of the compare array 208. For clarity, only two columns are shown. Also shown in FIG. 3 are two bits of the compare input 204 and corresponding circuitry from the buffer 206. FIG. 3 also shows a precharge mechanism 354.

As noted above, prior to a rising edge of the CLK 236 which latches the compare input 204 into the buffer 206, the mismatch indications 226 (including the dummy mismatch indication 240) are precharged to the high voltage state. The precharge mechanism 354 performs such precharging.

When the CLK 236 is low, AND gates 302, 304 in the buffer 206 prohibit the compare input 204 from passing to the rows of the compare array 208. Thus, the rows of the compare array 208 do not influence the mismatch indications 226.

However, when the CLK 236 is low, a transistor 355 associated with the precharge mechanism 354 is active. Thus, when the CLK 236 is low, the precharge mechanism 354 charges the mismatch indications 226, 240 to the high voltage state.

When the CLK 236 is high (signifying a pulse from the CLK 236), the transistor 355 associated with the precharge mechanism 354 turns off. Also, the AND gates 302, 304 in the buffer allow the compare input 204 to pass to the rows of the compare array 208.

The AND gates 302 produce complemented values 207A, 207C of the compare input 204. The AND gates 304 produce true values 207B, 207D of the compare input 204. The values 207A, 207B, 207C, and 207D represent the encoded compare input 207 in FIG. 2. Note that the compare input 204 must remain stable during the high time of CLK 236.

Each column of every row of the compare array 208 includes a D flip flop 306, AND gates 308, 310, an OR gate 312, and a transistor 314. Note that the AND gates 308, 310 and OR gate 312 implement a comparator. Initially, the transistor 314 is off (the transistor 314 is turned off by the operation of AND gates 302 and 304). The AND gates 308, 310 and OR gate 312 compare the data stored in the D flip flop 306 to the bit from the compare input 204 (actually, to the encoded compare input 207). If there is a match, then the output of the OR gate 312 remains low and the transistor 314 remains off. If there is a mismatch, however, then the output of the OR gate 312 transitions high and the transistor 314 turns on, thereby pulling the attached mismatch indication 226 from the high voltage state to the low voltage state. Note that any of the columns may pull down the mismatch indication 226. However, the mismatch indication 226 is pulled down faster if there are a number of attached columns which mismatch (and which are thereby working to pull down the mismatch indication 226).

The row of the compare array 208 shown in FIG. 3 is similar to the dummy row 214. As noted above, the M columns 216 of the dummy row 214 receive an M-bit value of all zeroes. For the M columns 216, the D flip flops 306 always contain zeros. Therefore, the M columns 216 always match.

For the additional row 215, the D flip flop 306 always contains a zero. Also, as noted above, the dummy input 205 is always 1. Therefore, the additional row 215 always mismatches.

Figure 4:
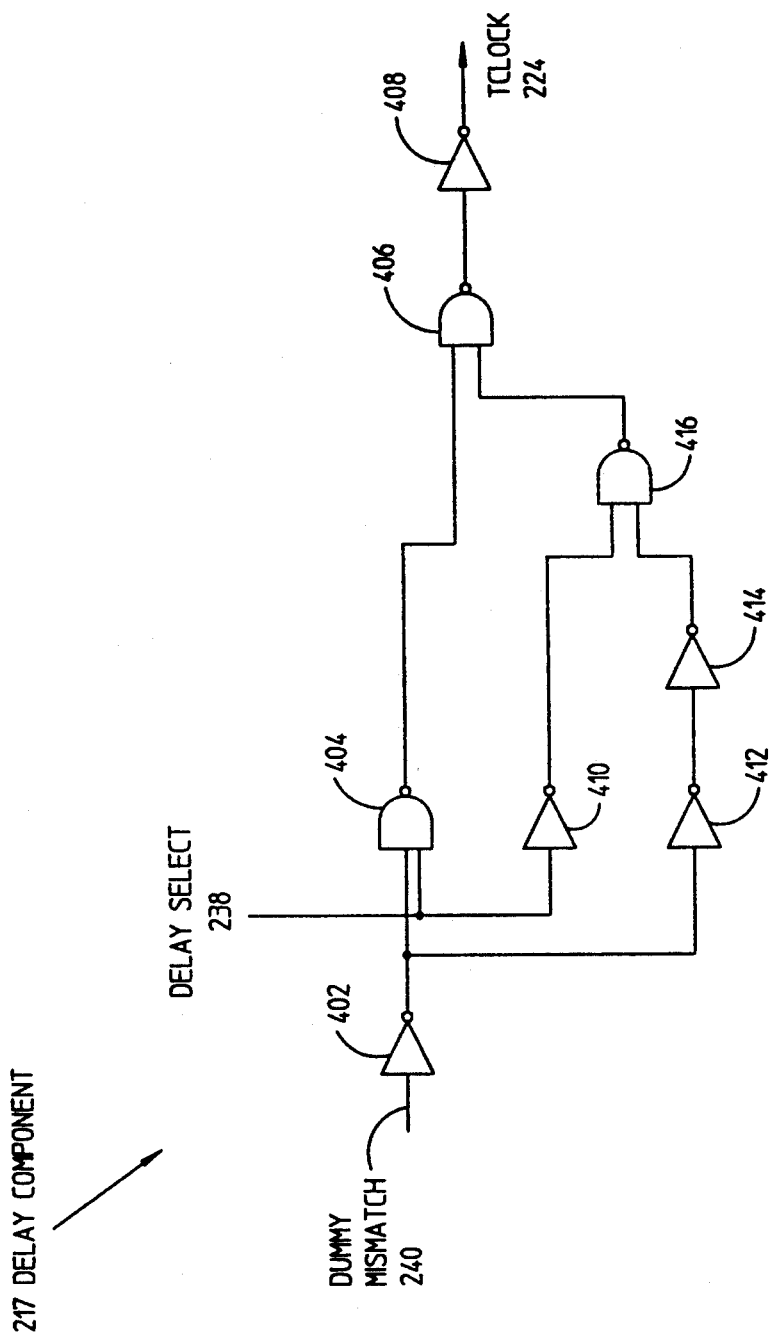
FIG. 4 illustrates a delay component 217 of the present invention.

FIG. 4 illustrates the delay and buffer component 217 in greater detail. The delay component 217 includes inverters 402, 408, 410, 412, and 414 and NAND gates 404, 406, and 416. The delay component 217 receives the dummy mismatch indication 240 and the delay select 238. The delay component 217 generates the Tclock signal 224. Depending on the value of the delay select 238, the Tclock signal 224 is either a 4-gate delayed or 6-gate delayed version of the dummy mismatch indication 240.

The delay component 217 operates as follows. If the delay select 238 is low, then the dummy mismatch indication 240 propagates through a path formed by the inverters 402, 412, 414, the NAND gates 416 and 406, and the inverter 408. This path includes 6 gate delays and is used during normal operation of the CAM 202. Note that the inverters 412, 414 represent the variable delay 220 from FIG. 2.

If the delay select 238 is high, then the dummy mismatch indication 240 propagates through a path formed by the inverter 402, the NAND gates 404, 406, and the inverter 408. This path includes 4 gate delays and is used when the CAM 202 is being tested. This path places an additional 25% stress on the CAM 202 (as compared to the path used when the delay select 238 is low).

Note that the delay introduced by the delay component 217 may be different for different implementations.

Figure 5:
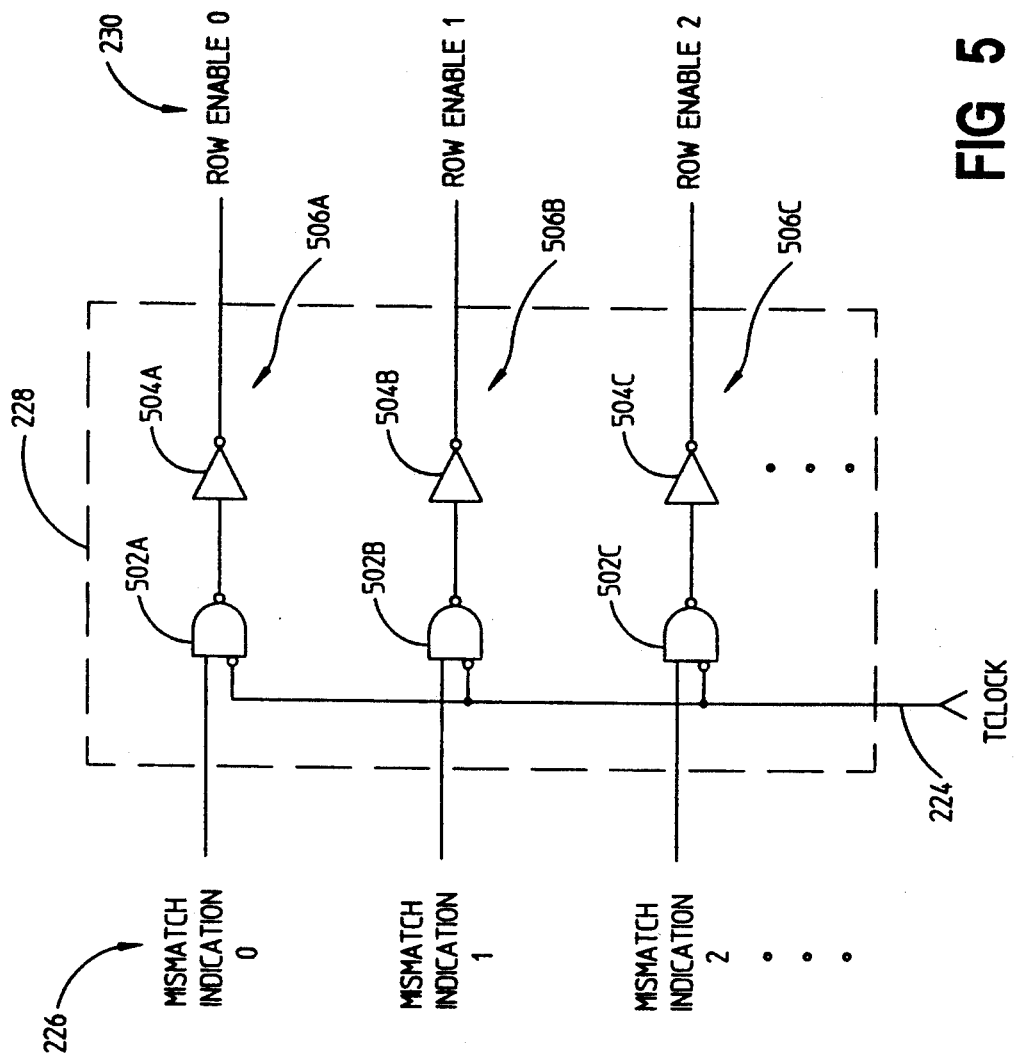
FIG. 5 illustrates a row driver 228 of the present invention.

FIG. 5 illustrates the row driver 228 in greater detail. For clarity, only the row driver circuitry 506 associated with three mismatch indications 226/row enables 230 are shown.

Each row driver circuit 506 includes a NAND gate 502 and an inverter 504. The NAND gates 502 receive the Tclock signal 224. The NAND gates 502 allow the mismatch indications 226 to propogate through the row driver circuits 506 when the Tclock signal 224 is pulsed (that is, when the Tclock signal 224 goes from a high to low voltage value, or equivalently, when the dummy mismatch 240 is pulled down from indicating a match to indicating a mismatch). In other words, the NAND gates 502 allow the row driver circuits 506 to receive the mismatch indications 226 only when the Tclock signal 224 is pulled low. (Note that the Tclock signal 224 is inverted before being input to the NAND gates 502.)

Figure 6:
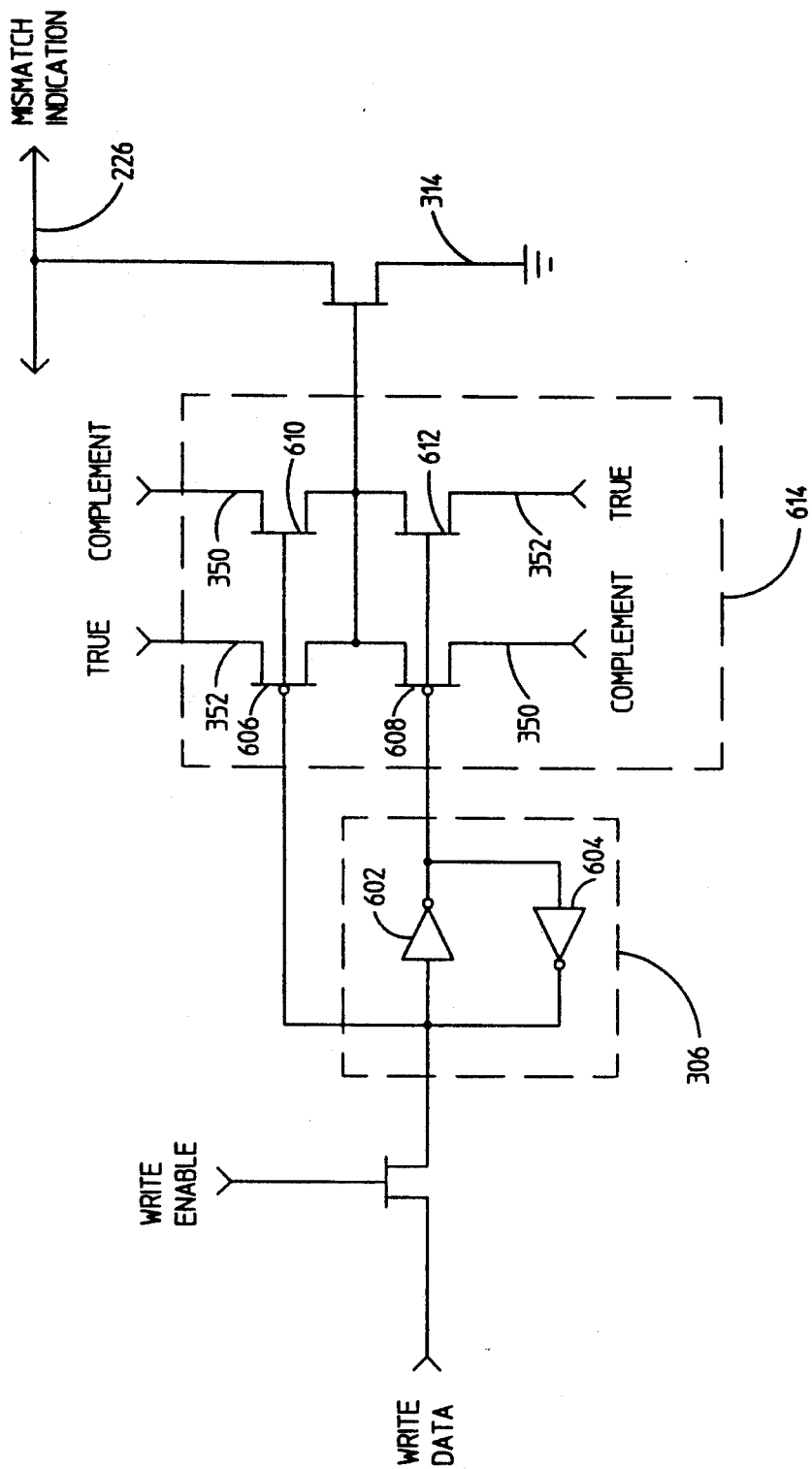
FIG. 6 illustrates a column of a row from the compare array 208 of the present invention.

FIG. 6 illustrates, in greater detail, a column of a row from the compare array 208. Each column of every row includes inverters 602, 604 and transistors 606, 608, 610, 612, and 314. Referring to both FIGS. 3 and 6, the inverters 602, 604 implement the functionality of the D flip flop 306. The transistors 606, 608, 610, and 612 implement the functionality of the comparator represented by the AND gates 308, 310 and the OR gate 312. The transistor 314 shown in FIG. 6 is the same as shown in FIG. 3. Based on the discussion included herein, and FIG. 6, the operation of the inverters 602, 604 and transistors 606, 608, 610, 612, and 314 will be obvious to those skilled in the art.

Figure 7:
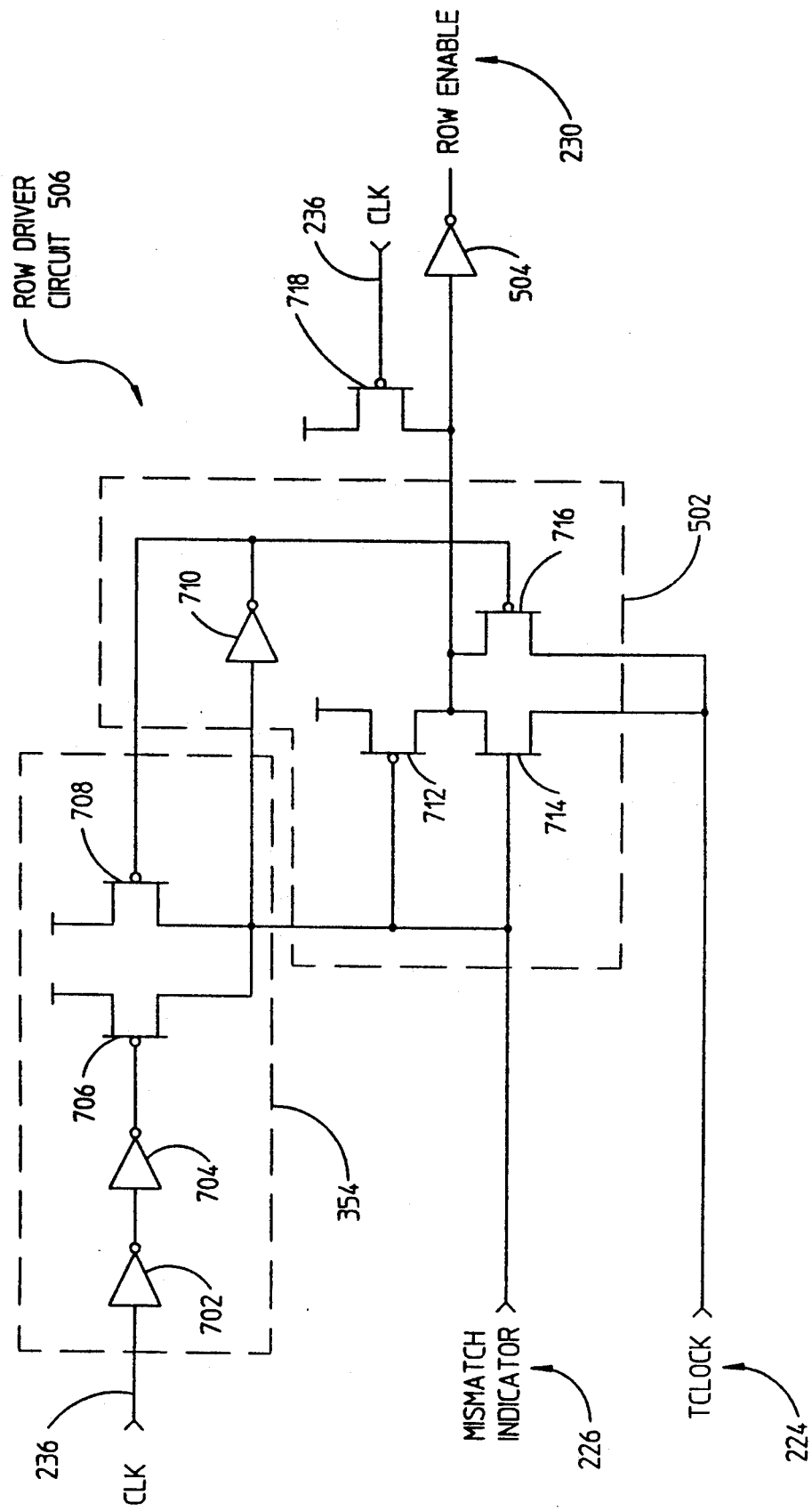
FIG. 7 illustrates a row driver circuit 506 of the present invention.

FIG. 7 illustrates, in greater detail, one of the row driver circuits 506 from FIG. 5. FIG. 7 also illustrates the precharge mechanism 354 of the present invention according to an alternate embodiment, wherein the precharge mechanism 354 includes transistors 706, 708 and two inverters 702, 704. Transistor 708 is a weak holdup transistor on the mismatch line 226.

The row driver circuit 506 shown in FIG. 7 includes transistors 712, 714, 716, 718 and inverters 710, 504. The transistors 712, 714, 716 and inverter 710 implement the functionality of the NAND gate 502 from FIG. 5. The inverter 504 shown in FIG. 7 is the same as shown in FIG. 5. Based on the discussion included herein, and FIG. 7, the operation of the transistors 708, 712, 714, 716, 718 and inverters 710, 504 will be obvious to those skilled in the art.

In the preferred embodiment of the present invention, the precharge mechanism 354 is located physically closed to the row driver circuits 506. This is illustrated in FIG. 7. Such placement of the precharge mechanism 354 is necessary in light of concerns involving clock distribution. Other concerns involving clock distribution and other external factors (such as power distribution) are well known. The implementation of the CAM 202 of the present invention will be obvious to those skilled in the art based on the discussion contained herein, and on well-known implementation knowledge.

Note that the self-timing feature of the present invention is generally applicable in devices having a first component (such as the compare array 208) and a second component (such as the row driver 228), wherein the second component receives the output (such as the mismatch indications 226) of the first component. Specifically, the self-timing feature of the present invention may be used to determine when the output of the first component is valid.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A memory device, comprising:
   (1) a compare array, comprising:
      (a) first receiving means for receiving a first compare input and a first clock signal;
      (b) first storage means for storing a first data word;
      (c) first comparator means, coupled to the first receiving means and the first storage means, for receiving the first compare input from the first receiving means after the first receiving means receives the first clock signal, for comparing the first compare input to the first data word, and for generating a first mismatch indication signal based on the comparison of the first compare input to the first data word;
   (2) means for generating a second clock signal, comprising:
      (a) second receiving means for receiving a second compare input and the first clock signal;
      (b) second storage means for storing a second data word;
      (c) second comparator means, coupled to the second receiving means and the second storage means, for completely receiving the second compare input from the second receiving means after the second receiving means receives the first clock signal, for comparing the second compare input to the second data word, and for generating a second mismatch indication signal based on the comparison of the second compare input to the second data word;
      (d) means, coupled to the second comparator means, for processing the second mismatch indication signal to generate the second clock signal;
   (3) row driver means, coupled to the compare array and the second clock signal generating means, for receiving the first mismatch indication signal and the second clock signal, and for generating a row enable signal based on the first mismatch indication signal after receiving the second clock signal.

2. The memory device of claim 1, further comprising:
   (4) means, coupled to the first and second comparator means, for charging said first and second mismatch indication signals to a first predetermined level prior to reception of said first clock signal by said first and second receiving means.

3. The memory device of claim 2, wherein said first compare input and said first data word each comprises M bits, wherein M is an integer greater than zero, and wherein said first comparator means comprises M comparators each comprising means for comparing one of the first compare input bits to one of the first data word bits, each of said M comparators also comprising means for discharging said first mismatch indication signal from the first predetermined level to a second predetermined level when said one of the first compare input bits does not match said one of the first data word bits.

4. The memory device of claim 3, wherein said second comparator means comprises a second comparator for comparing a predetermined bit of the second compare input to a predetermined bit of the second data word, said second comparator also for discharging said second mismatch indication signal from the first predetermined level to a second predetermined level when the predetermined bit of the second compare input does not match the predetermined bit of the second data word.

5. The memory device of claim 1, wherein said means for processing the second mismatch indication signal to generate the second clock signal comprises:
   delay means, coupled to the second comparator means, for receiving the second mismatch indication signal, and for delaying electrical propagation of the second mismatch indication signal; and
   means, coupled to the delay means, for amplifying the delayed second mismatch indication signal, wherein the amplified second mismatch indication signal is electrically propagated as the second clock signal to the row driver means.

6. The memory device of claim 5, wherein said means for processing the second mismatch indication signal to generate the second clock signal further comprises user-controllable means, coupled to the delay means, for inhibiting said delay means such that electrical propagation of the second mismatch indication signal is not delayed.

7. In a memory device having a compare array, wherein the compare array includes means for receiving first input data and a first clock signal, and for processing the first input data to generate a first output signal after the compare array receiving means receives the first clock signal, a system for determining when the first output signal is valid, said system comprising:

means for storing a data word having a first bit equal to a first predetermined value and M second bits each equal to the first predetermined value, wherein M is an integer greater than zero;

receiver means for receiving the first clock signal and second input data, the second input data having a first bit equal to a second predetermined value and M second bits each equal to the first predetermined value;

means for charging a second output signal to a first predetermined level;

a first comparator, coupled to the storing means, the receiver means, and the charging means, for comparing the first bit of the second input data to the first bit of the data word after the receiver means receives the first clock signal, said first comparator also for discharging the second output signal from the first predetermined level to a second predetermined level when the first bit of the second input data does not match the first bit of the data word;

M second comparators, coupled to the storing means, the receiver means, and the charging means, for comparing the second bits of the second input data to the second bits of the data word after the receiver means receives the first clock signal, said M second comparators also for discharging the second output signal from the first predetermined level to the second predetermined level when the second bits of the second input data does not match the second bits of the data word; and means, coupled to the first and second comparators, for processing the second output signal to generate a second clock signal, the first output signal being valid when the second clock signal is generated;

wherein the first comparator operates to discharge the second output signal since the first bits of the second input data and the data word never match, and wherein the second comparators do not operate to discharge the second output signal since the second bits of the second input data and the data word always match.

8. The system of claim 7, wherein the means for processing the second output signal to generate the second clock signal comprises:

means, coupled to the first and second comparators, for delaying electrical propagation of the second output signal; and user-controllable means, coupled to the delaying means, for inhibiting said delaying means such that electrical propagation of the second output signal is not delayed.

* * * * *